US009334197B2

(12) United States Patent
Inamori et al.

(10) Patent No.: US 9,334,197 B2
(45) Date of Patent: May 10, 2016

(54) METHOD FOR PRODUCING CERAMIC COMPOSITE FOR LIGHT CONVERSION

(75) Inventors: Dai Inamori, Ube (JP); Takafumi Kawano, Ube (JP)

(73) Assignee: Ube Industries, Ltd., Ube-shi (JP)

(*) Notice: Subject to any disclaimer, the term of this patent is extended or adjusted under 35 U.S.C. 154(b) by 40 days.

(21) Appl. No.: 14/131,057

(22) PCT Filed: Jul. 6, 2012

(86) PCT No.: PCT/JP2012/067342
§ 371 (c)(1),
(2), (4) Date: Jan. 29, 2014

(87) PCT Pub. No.: WO2013/008751
PCT Pub. Date: Jan. 17, 2013

(65) Prior Publication Data
US 2014/0138348 A1    May 22, 2014

(30) Foreign Application Priority Data

Jul. 8, 2011   (JP) .................... 2011-152257

(51) Int. Cl.
*B44C 1/22*   (2006.01)
*C03C 15/00*   (2006.01)
*C03C 25/68*   (2006.01)
*C23F 1/00*   (2006.01)
*C25F 3/00*   (2006.01)
*C04B 41/91*   (2006.01)
(Continued)

(52) U.S. Cl.
CPC ............ *C04B 41/91* (2013.01); *B24B 37/042* (2013.01); *C04B 35/117* (2013.01); *C04B 35/44* (2013.01); *C04B 35/652* (2013.01); *C04B 35/653* (2013.01); *C04B 41/009* (2013.01); *C04B 41/5346* (2013.01); *C09K 11/7774* (2013.01); *C04B 2111/80* (2013.01); *C04B 2235/3217* (2013.01); *C04B 2235/3222* (2013.01); *C04B 2235/3224* (2013.01); *C04B 2235/3225* (2013.01); *C04B 2235/3229* (2013.01); *C04B 2235/6581* (2013.01); *C04B 2235/764* (2013.01); *C04B 2235/963* (2013.01); *H01L 33/501* (2013.01); *H01L 2224/13* (2013.01); *H01L 2924/12044* (2013.01)

(58) Field of Classification Search
USPC ..................................................... 216/58, 57
See application file for complete search history.

(56) References Cited

U.S. PATENT DOCUMENTS

2006/0214172 A1* 9/2006 Hsu et al. ................. 257/88
2008/0041106 A1* 2/2008 Seneschal-Merz et al. ... 65/33.2
2010/0244067 A1* 9/2010 Winkler et al. ............ 257/98

FOREIGN PATENT DOCUMENTS

CN    1621469 A    6/2005
EP    1980606 A1   10/2008
(Continued)

*Primary Examiner* — Thomas Pham
(74) *Attorney, Agent, or Firm* — The Webb Law Firm

(57) ABSTRACT

A method for producing a ceramic composite for light conversion including first step of forming the step level difference such that an oxide crystal phase other than Al2O3 phase of a surface of a solidified body is in a convex shape relative to an Al2O3 phase by subjecting the surface of the solidified body having a structure in which the Al2O3 phase and the oxide crystal phase other than Al2O3 phase are continuously and three-dimensionally entangled with each other to dry etching, and a second step of reducing the step level difference by subjecting the solidified body subjected to the dry etching to CMP or MP.

20 Claims, 3 Drawing Sheets

(51) Int. Cl.
*C04B 35/117* (2006.01)
*C04B 35/65* (2006.01)
*C04B 35/44* (2006.01)
*C04B 35/653* (2006.01)
*C09K 11/77* (2006.01)
*B24B 37/04* (2012.01)
*C04B 41/00* (2006.01)
*C04B 41/53* (2006.01)
*H01L 33/50* (2010.01)
*C04B 111/80* (2006.01)

(56) References Cited

FOREIGN PATENT DOCUMENTS

| | | |
|---|---|---|
| EP | 2070891 A1 | 6/2009 |
| EP | 2650082 A1 | 10/2013 |
| JP | 2004335722 A | 11/2004 |
| JP | 2006173433 A | 6/2006 |
| JP | 2009297818 A | 12/2009 |
| WO | 2004065324 A1 | 8/2004 |
| WO | 2007018222 A1 | 2/2007 |
| WO | 2007148829 A1 | 12/2007 |
| WO | WO 2007148829 A1 * | 12/2007 |

* cited by examiner

METHOD FOR PRODUCING CERAMIC COMPOSITE FOR LIGHT CONVERSION

CROSS-REFERENCE TO RELATED APPLICATIONS

This application is the United States national phase of International Application No. PCT/JP2012/067342 filed Jul. 6, 2012, and claims priority to Japanese Patent Application No. 2011-152257 filed Jul. 8, 2011, the disclosure of which is hereby incorporated by reference in its entirety.

TECHNICAL FIELD

The present invention relates to a method for producing a ceramic composite for light conversion used in a light-emitting diode applicable to displays, lighting, light source of backlight and the like.

BACKGROUND ART

In recent years, studies have been extensively conducted to develop a white light-emitting device using a blue light-emitting element as a light-emitting source. In particular, a white light-emitting device using a blue light-emitting element not only provides a long service life and consuming less electric power compared to an incandescent lamp or a fluorescent lamp, but also uses no hazardous substance such as mercury, and hence a lighting apparatus using a white light-emitting device is becoming practical use at present.

A method most frequently used to obtain white light using a blue color of a blue light-emitting element as a light source is a method of obtaining a pseudo-white color by mixing blue with yellow, which is the complementary color of blue.

For example, in a typical white light-emitting device, a blue light-emitting element is sealed with a transparent resin containing a yellow light-emitting phosphor (for example, Ce-containing YAG ($Y_3Al_5O_{12}$) phosphor). A blue light (a wavelength: 450 to 460 nm) is emitted from this blue light-emitting element, and YAG is excited by part of the blue light, and as a result a yellow light is emitted from this YAG phosphor.

When a blue light-emitting element is sealed with a light transmitting resin material such as an epoxy resin, however, it is known that deterioration such as yellowing occurs, which is caused by light emitted from the light-emitting element on light from the outside. In addition, if high current is used in order to obtain high brightness in a white light-emitting device, deterioration of sealing resin occurs owing to heat generated by an element itself. Moreover, the efficiency of light-emitting is reduced owing to the moisture absorption of the sealing resin and the like in some cases.

Considering such circumstances, the present inventors have proposed a white light-emitting device composed of a blue light-emitting element and a ceramic composite for light conversion consisting of a solidified body in which a plurality of oxide crystal phases including an $Al_2O_3$ phase and a Ce-containing YAG fluorescent substance phase that emits fluorescence are continuously and three-dimensionally entangled with each other (Patent Literatures 1 and 2). A ceramic composite for light conversion enables stably emitting homogeneous yellow fluorescence owing to uniform distribution of a fluorescent substance phase, and is excellent in durability since it is ceramic. Thus, the problem which occurs when the composite is sealed with an epoxy resin and the like is solved and it is possible to provide a white light-emitting device with high reliability.

The white light-emitting device using this ceramic composite for light conversion is composed of, for example, a blue light-emitting element to be flip-chip mounted, a circuit board having a wiring pattern formed thereon, which performs power receiving and supplying with respect to the blue light-emitting element, and a ceramic composite for light conversion directly bonded with the blue light-emitting element.

In addition, hitherto, a substrate for a light-emitting diode obtained by laminating a single crystal layer capable of fabricating a light-emitting diode element and a ceramic composite layer for light conversion consisting of a solidified body in which at least two or more of oxide crystal phases selected from a monometal oxide and a composite metal oxide are continuously and three-dimensionally entangled with each other, is proposed (Patent Literature 3).

As such a substrate for fabricating a light-emitting diode element, a single crystal substrate such as sapphire is generally used (Patent Literature 4). The method for finishing the surface of this single crystal substrate as an even surface without polishing marks such as scratches generated during polishing includes, in general, a mechanical polishing (hereinafter, referred to as "MP"), such as grinding and lapping, in which the particle diameter of an abrasive grain such as diamond, which is a harder material than a material to be processed, is decreased stepwise, and a chemical mechanical polishing (hereinafter, referred to as "CMP") which is performed using an abrasive grain softer than a material to be processed, such as colloidal silica, and a polishing liquid involving a chemical action. Thus it is known that, by polishing according to MP, CMP, and the like, the surface of the single crystal substrate becomes a smooth surface with an arithmetic mean roughness (Ra) of less than 1 nm.

CITATION LIST

Patent Literatures

Patent Literature 1: JP 2006-173433 A
Patent Literature 2: WO 2004/065324 A
Patent Literature 3: WO 2007/018222 A
Patent Literature 4: JP 2009-297818 A

SUMMARY OF INVENTION

Technical Problem

These processing methods, however, are suitable for the polishing of a single crystal substrate consisting of a single crystal phase, but in a case of a composite material which consists of two or more kinds of crystal phases having the same surface configuration, if polishing such as MP or CMP is performed, since the mechanical action and chemical action are different in each of the crystal phases, the polishing rates of the respective crystal phases are different from each other, and thus difference in level with an uneven configuration between the crystal phases (hereinafter, referred to as "step level difference") are generated.

If the solidified body having a structure, in which an $Al_2O_3$ phase and an oxide crystal phase other than $Al_2O_3$ phase are continuously and three-dimensionally entangled with each other, is polished by the methods described above, since the material properties (hardness or crystal orientation) of the $Al_2O_3$ phase and the oxide crystal phase other than $Al_2O_3$ phase are different from each other, the surface of the $Al_2O_3$ phase is in a convex shape relative to the oxide crystal phase other than $Al_2O_3$ phase, and hence a great step level difference at the boundary between the $Al_2O_3$ phase and the oxide crystal phase other than $Al_2O_3$ phase is generated. Accordingly, it is difficult to even out the solidified body through polishing by the methods described above. In addition, since it takes a long time to polish by the methods described above, there is also an industrial problem.

In addition, in Patent Literature 3, in order to laminate a single crystal layer and a layer of ceramic composite for light conversion, a method for directly bonding the layers to each other at a high temperature, or a method for bonding the layers using a very small amount of a material with low melting point embedded therebetween as a bonding layer, is disclosed. If the bonding interface between the single crystal layer and the layer of ceramic composite for light conversion is even, however, it is possible to directly bond the layer of ceramic composite for light conversion and the single crystal layer not only by the method described above but also by a surface activating bonding method, and therefore it is important that the bonding interface is even.

The present invention is achieved in view of such circumstances, and an object of the present invention is to provide a method for producing a ceramic composite for light conversion, in which the surface thereof can be effectively evened out, even though it consists of a solidified body having a structure in which an $Al_2O_3$ phase and an oxide crystal phase other than $Al_2O_3$ phase are continuously and three-dimensionally entangled with each other.

Solution to Problem

In order to achieve the object described above, the present inventors have conducted intensive research, and as a result have found the following facts, thereby completing the present invention. By performing dry etching of the surface of a solidified body having a structure, in which an $Al_2O_3$ phase and an oxide crystal phase other than $Al_2O_3$ phase are continuously and three-dimensionally entangled with each other, a step level difference is formed such that the oxide crystal phase other than $Al_2O_3$ phase of the surface of the solidified body is in a convex shape relative to the $Al_2O_3$ phase, and then the step level difference is reduced by performing MP or CMP of the solidified body subjected to the dry etching, whereby the ceramic composite for light conversion having an even surface may be effectively produced.

In other words, the present invention provides a method for producing a ceramic composite for light conversion including a first step of forming a step level difference such that an oxide crystal phase other than $Al_2O_3$ phase of a surface of a solidified body is in a convex shape relative to an $Al_2O_3$ phase by performing dry etching of the surface of the solidified body having a structure in which the $Al_2O_3$ phase and the oxide crystal phase other than $Al_2O_3$ phase are continuously and three-dimensionally entangled with each other, and a second step of reducing the step level difference by performing CMP or MP of the solidified body subjected to the dry etching.

In addition, the present invention provides a method for producing a ceramic composite for light conversion, in which the oxide crystal phase other than $Al_2O_3$ phase is a fluorescence emitting phosphor, and is a YAG ($Y_3Al_5O_{12}$) phase containing Ce or a YAG ($Y_3Al_5O_{12}$) phase containing Ce and Gd.

In addition, the present invention provides a method for producing a ceramic composite for light conversion, in which the step level difference after the processing in the second step is 0.005 μm or less.

In addition, the present invention provides a method for producing a ceramic composite for light conversion, in which a processing for reducing the step level difference in the second step is CMP.

In addition, the present invention provides a method for producing a ceramic composite for light conversion, in which slurry containing a silica particle in an amount of 0.1% by mass or more and less than 5% by mass is used as a polishing liquid when performing the CMP.

In addition, the present invention provides a method for producing a ceramic composite for light conversion, in which a pressing load per unit area in the CMP process is from 10 to 50 kPa.

Advantageous Effects of Invention

According to the present invention, there is provided a method of producing a ceramic composite for light conversion in which the surface thereof can be effectively evened out, even though the ceramic composite for light conversion consists of a solidified product having a structure, in which an $Al_2O_3$ phase and an oxide crystal phase other than $Al_2O_3$ phase are continuously and three-dimensionally entangled with each other. That is, according to a method of the present invention, it is possible to obtain effectively a ceramic composite for light conversion with an even surface.

DESCRIPTION OF EMBODIMENTS

Figure 1:
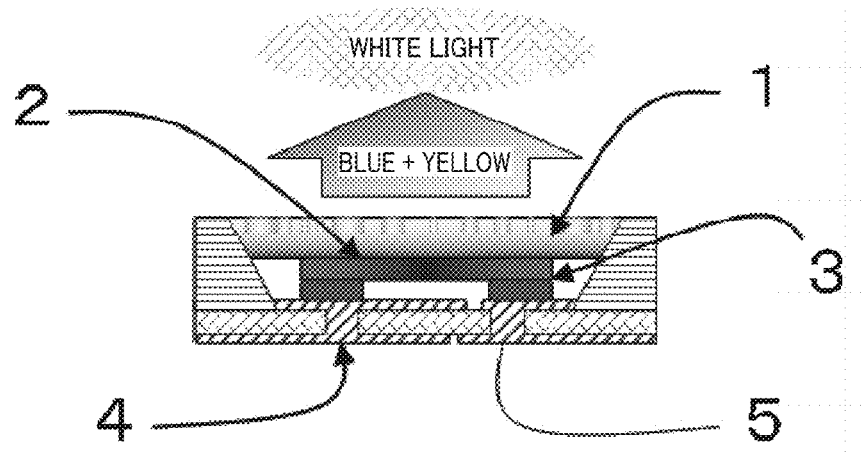
FIG. 1 is a cross-sectional view schematically illustrating a light-emitting device using a ceramic composite for light conversion according to the present invention.

First, there will be described a solidified body to be used in a production method of a ceramic composite for light conversion according to the present invention and have a structure in which the $Al_2O_3$ phase and the oxide crystal phase other than $Al_2O_3$ phase are continuously and three-dimensionally entangled with each other.

A solidified body having a structure in which the $Al_2O_3$ phase and the oxide crystal phase other than $Al_2O_3$ phase are continuously and three-dimensionally entangled with each other is manufactured by melting oxide raw materials and solidifying the melt. For example, a solidified body may be obtained by a simple method, in which the melt introduced in a crucible kept at a predetermined temperature is cooling solidified while controlling the cooling temperature. A solidified body manufactured by a unidirectional solidification is preferable as a ceramic composite for light conversion because, by performing a unidirectional solidification, a crystal phase contained in the solidified body is continuously grown in a single crystal state and attention of light in the member is reduced.

As a production method of the solidified body, except that an oxide crystal phase emitting fluorescence is contained, the same method as the production method of a ceramic composite disclosed in JP 7-149597 A, JP 7-187893 A, JP 8-81257, JP 8-253389 A, JP 8-253390 A, and JP 9-67194 A, which are previously applied by the present applicant, and the U.S. applications (U.S. Pat. No. 5,569,547, U.S. Pat. No. 5,484,752, U.S. Pat. No. 5,902,963) corresponding to these Japanese patent applications, and the like may be used.

A preferable solidified body constituting a ceramic composite for light conversion is one in which the oxide crystal phase other than $Al_2O_3$ phase is a fluorescence emitting phosphor and is a YAG ($Y_3Al_5O_{12}$) phase containing Ce (hereinafter, referred to as "YAG:Ce phase") or a YAG ($Y_3Al_5O_{12}$) phase containing Ce and Gd (hereinafter, YAG:Gd and Ce phase"). In a case where the oxide crystal phase other than $Al_2O_3$ phase is a YAG:Ce phase or a YAG:Gd and Ce phase, when a ceramic composite for light conversion receives a blue light, an $Al_2O_3$ phase transmits part of the blue light, and the oxide crystal phase other than $Al_2O_3$ phase absorbs part of the blue light and emits yellow fluorescence, and then the blue light and the yellow light are mixed together, thereby obtaining white light-emitting. The ceramic composite for light conversion, in which the oxide crystal phase other than $Al_2O_3$ phase is a fluorescence emitting phosphor and is a YAG:Ce phase or a YAG:Gd and Ce phase, is known and disclosed in WO 2008-041566 filed by the present applicant previously, and the like.

Since YAG:Ce phase absorbs a violet to blue excitation light of 400 to 500 nm and emits fluorescence with a peak at a wavelength of 530 to 560 nm, and a YAG:Gd and Ce phase absorbs a violet to blue excitation light of 400 to 500 nm and emits fluorescence with a peak at a wavelength of 540 to 580 nm, the solidified body in which the oxide crystal phase other than $Al_2O_3$ phase is a YAG:Ce phase or a YAG:Gd and Ce phase, is suitable as a light conversion member for a white light-emitting device to be used in combination with a light emitting element of a blue light or a violet light.

At the boundary between the $Al_2O_3$ phase and the oxide crystal phase other than $Al_2O_3$ phase of the solidified body used in the present invention, a boundary layer such as an amorphous phase is not present, but the $Al_2O_3$ phase and the oxide crystal phase other than $Al_2O_3$ phase are in contact with each other directly. Therefore in the ceramic composite for light conversion in the present invention, loss of light in the inside is little and light transmittance is also high. In addition, since the oxide crystal phases emitting fluorescence have a structure in which they are continuously and three-dimensionally entangled with each other, and the above described both phases are uniformly distributed in the ceramic composite for light conversion as a whole, it is possible to obtain homogeneous fluorescence without partial deviation. Further, in a case where the oxide crystal phase is a YAG:Ce phase or a YAG:Gd and Ce phase, when a violet to blue light is incident on the ceramic composite for light conversion, fluorescence from a fluorescent substance phase and transmitted light from a light transmitting phase may be obtained at the same time. When the light-emitting element of a blue light or a violet light and the ceramic composite for light conversion are in contact with each other directly, the blue light or the violet light is effectively incident on the ceramic composite for light conversion, and thus a white light with a high intensity may be obtained.

Incidentally, as described below, if it is possible to even out the bonding interface between the ceramic composite for light conversion and the blue light-emitting element to a great extent, a direct bonding of the ceramic composite for light conversion and the blue light-emitting element, for example, by a surface activating bonding method, may be adopted.

In addition, since a solidified body used in the present invention is composed of only inorganic oxide ceramics, the solidified body is excellent in heat resistance and durability, and also deterioration due to light and the like does not occur. For that reason, it is possible to provide a ceramic composite for light conversion suitable for a white light-emitting device with high reliability and efficiency in combination with a light-emitting element of a blue light or a violet light.

Subsequently, the method for producing a ceramic composite for light conversion according to the present invention will be described. First, the first step of the present invention will be described in detail.

The first step of the present invention is a step of performing dry etching to a plate-like solidified body having a structure in which a $Al_2O_3$ phase and an oxide crystal phase other than $Al_2O_3$ phase are continuously and three-dimensionally entangled with each other. As a plate-like solidified body to be subjected to dry etching, any of a solidified body sliced to a predetermined thickness and a solidified body with a ground, lapped or polished surface in advance may be used, and it is not particularly limited. However, if a solidified body in which the step level difference and the surface roughness in the phases are adjusted to the extent that they are not too large by grinding, lapping, or polishing, is used, the time required for the first step and the second step are shortened, and thus it is preferable to use a solidified body with a surface subjected to grinding, lapping, or polishing. Grinding, lapping, or polishing of the surface of a solidified body may be performed by, for example, surface grinding, gliding, one side lapping, both side lapping, buffing, CMP, and the like, but it is not limited to these methods.

For the dry etching in the first step of the present invention, a general dry etching apparatus may be used. Since, in a general dry etching apparatus, the etch selectivity ratio (a ratio of etching rate of a $Al_2O_3$ phase to that of an oxide crystal phase other than $Al_2O_3$ phase) may be controlled by supplied power, bias power, the atmosphere of etching gas, and the like, it is possible to suppress the step level difference generated at the boundary between the $Al_2O_3$ phase and the oxide crystal phase other than $Al_2O_3$ phase. As a dry etching apparatus, for example, a general dry etching apparatus such as a reactive ion etching (RIE) type, a capacitive coupled plasma (CCP) type, and an inductive coupled plasma (ICP) type may be used.

In addition, as a gas for dry etching, a gas generally used in production of a semiconductor and liquid crystal, such as $Cl_2$, $SiCl_4$, $BCl_3$, HBr, $SF_6$, $CHF_3$, $C_4F_8$, $CF_4$, and Ar, may be used singly or in a mixed form.

Where the oxide crystal phase other than $Al_2O_3$ phase with a lower polishing rate compared to that of the $Al_2O_3$ phase is processed into a convex shape and the height of the oxide crystal phase other than $Al_2O_3$ phase is adjusted in the first step, and CMP or MP is performed in the second step, the step level difference in the surface of the $Al_2O_3$ phase and the oxide crystal phase other than $Al_2O_3$ phase may be reduced to 0.005 µm or less in a short time.

In the first step, it is preferable that the step level difference formed on the surface of the solidified body in which the oxide crystal phase other than $Al_2O_3$ phase is in a convex shape relative to the $Al_2O_3$ phase, is 0.500 µm or less. If the step level difference is greater than 0.500 µm, the time for processing to reduce the step level difference in the surface of the $Al_2O_3$ phase and the oxide crystal phase other than $Al_2O_3$ phase to 0.005 μm or less becomes longer, when CMP or MP is performed in the second step, therefore it is not preferable.

Next, the second step of the present invention will be specifically described.

In the second step, CMP or MP is performed in order to reduce the step level difference between the $Al_2O_3$ phase and the oxide crystal phase other than $Al_2O_3$ phase on the surface of the solidified body after dry etching of the first step. CMP is a technique to even out the surface of a material to be processed at high speed by the following effect. The mechanical polishing effect generated on the surface of the material to be processed is improved generally by an action of chemical reaction on the abrasive grain and the solid surface of the material to be processed or an action of chemical etching by a chemical in the polishing liquid. According to CMP, it is easy to control the step level difference precisely, and it is generally possible to reduce surface roughness of the material to be processed compared to MP, and thus CMP is preferably used in the second step.

When the processing in the second step of the present invention is CMP, as a polishing liquid, slurry containing silica particles, an $Al_2O_3$ particle, a $CeO_2$ particle, a $Mn_2O_3$ particle, a diamond particle, and the like may be used, and slurry containing silica particles is preferably used. When slurry containing a silica particle is used as a polishing liquid, the content of the silica particles in the slurry used needs to be adjusted appropriately depending on the step level difference between the $Al_2O_3$ phase and the oxide crystal phase other than $Al_2O_3$ phase on the surface of the solidified body formed by dry etching in the first step and the selective ratio of polishing rate. For example, when the step level difference between the $Al_2O_3$ phase and the oxide crystal phase other than $Al_2O_3$ phase formed in the first step is 0.100 μm or greater, it is preferable to use a polishing liquid containing 1% by mass or more and less than 5% by mass of silica particle, and further it is preferable to use a polishing liquid containing 2% by mass or more and less than 3% by mass of silica particle. In addition, when the step level difference between the $Al_2O_3$ phase and the oxide crystal phase other than $Al_2O_3$ phase formed in the first step is less than 0.100 μm, it is preferable to use a polishing liquid containing 0.1% by mass or more and less than 1% by mass of silica particle, and further it is preferable to use a polishing liquid containing 0.2% by mass or more and less than 0.3% by mass of silica particle. The content of the silica particle of this polishing liquid is set based on the step level difference between the $Al_2O_3$ phase and the oxide crystal phase other than $Al_2O_3$ phase to be subjected to CMP and the stability of the polishing liquid, and in the present invention, it is preferable to use a polishing liquid containing 0.1% by mass or more and less than 5% by mass of silica particle. This is because if a polishing liquid containing 5% by mass or more of silica particle is used, the polishing rate of the oxide crystal phase other than $Al_2O_3$ phase becomes excessively great, and thus it is difficult to control the processing time, and if a polishing liquid containing less than 0.1% by mass of silica particle content is used, polishing rate decreases and thus the time required for polishing becomes longer.

As a polishing liquid used in CMP, for example, a polishing liquid, in which slurry containing a silica particle is diluted with pure water, may be used. As a commercially available polishing slurry, for example, "Quartron (registered trademark) PL series" of colloidal silica polishing slurry manufactured by FUSO CHEMICAL CO., LTD., and the like may be used. By diluting commercially available polishing slurry, such as colloidal silica, with pure water, a polishing liquid adjusted to a desired concentration may be obtained. When CMP is performed in the second step of the present invention, as a polishing liquid for this case, general polishing slurry for CMP may be used regardless of the pH thereof and the presence or absence of additive containment. Depending on the pH of a polishing liquid, difference in polishing rate of the $Al_2O_3$ phase and the oxide crystal phase other than $Al_2O_3$ phase is generated, but a polishing condition may be appropriately adjusted depending on the pH.

General polishing slurry for CMP is used in planarization process in a semiconductor or liquid crystal production, and contains an abrasive, an organic compound (surfactant, coloring inhibitor), an oxidant, and a pH adjuster (inorganic acid or alkali) as main components in many cases. Since such polishing slurry is very expensive and contains various chemicals as a solid abrasive grain and an additive, a problem such as complicated waste water treatment thereof is pointed out. For example, where a sapphire single crystal substrate is subjected to CMP, a polishing liquid composition containing an alkanolamine compound and a fluorine-based compound having a perfluoroalkyl group is known (Patent Literature 4). In this case, the performance removal of fluorine in fluorine-based waste water is affected, and a water quality value lower than the standard value, which is the target value of the fluorine-based waste water treatment facility, is not obtained unexpectedly in some cases.

In the present invention, since a polishing liquid containing a special additive and the like is not necessary for CMP of the second step, the environmental load is low in the waste water treatment as well, and a production method with low cost may be provided. However, in the present invention, there is no limitation on using the slurry containing the additive described above, and the slurry containing the additive described above may be used without any problem.

Further, in the second step of the present invention, when performing CMP, the unit load applied to the solidified body after dry etching is preferably 10 to 50 kPa, and further preferably 10 to 33 kPa. If the unit load is lower than 10 kPa, polishing rate may decrease, and if the unit load is higher than 50 kPa, precise adjustment of the step level difference between the $Al_2O_3$ phase and the oxide crystal phase other than $Al_2O_3$ phase may become difficult.

For the CMP in the second step, a general polishing apparatus may be used. It is preferable to perform CMP by installing the solidified body after dry etching to a rotating polishing head, and CMP may be performed by pushing the solidified body after dry etching installed to the polishing head rotating at about 50 rpm (revolution per minute) against a polishing pad rotating at about 50 rpm.

According to the method of producing the ceramic composite for light conversion relating to the present invention, if, in the first step, dry etching is performed on the surface of the solidified body such that the oxide crystal phase other than $Al_2O_3$ phase with a faster polishing rate compared to the $Al_2O_3$ phase has a convex shape, and the height of the oxide crystal phase other than $Al_2O_3$ phase is adjusted and then CMP or MP is performed in the second step, the step level difference between the $Al_2O_3$ phase and the oxide crystal phase other than $Al_2O_3$ phase on the surface of the solidified body may be reduced to 0.005 μm or less in a short time. Since the time for dry etching of the first step required for performing the present invention is also a short time, according to the present invention, the step level difference between the $Al_2O_3$ phase and the oxide crystal phase other than $Al_2O_3$ phase may be reduced very effectively. In addition, depending on the combination of the condition for dry etching and the condition of the CMP or MP, after the CMP or MP, the $Al_2O_3$ phase is in a convex shape relative to the oxide crystal phase other than $Al_2O_3$ phase in some cases. In the second step, reducing the step level difference may be reducing the absolute value of the step level difference formed in the first step, and the $Al_2O_3$ phase may be in a convex shape relative to the oxide crystal phase other than $Al_2O_3$ phase.

The ceramic composite for light conversion obtained according to the present invention is composed by a solidified body having a structure in which the $Al_2O_3$ phase and the oxide crystal phase other than $Al_2O_3$ phase are continuously and three-dimensionally entangled with each other, and is a ceramic composite with the step level difference between the $Al_2O_3$ phase and the oxide crystal phase other than $Al_2O_3$ phase of 0.005 μm or less in the light receiving surface, in which the $Al_2O_3$ phase transmits a part of received light and the oxide crystal phase other than $Al_2O_3$ phase absorbs a part of the light and emits fluorescence.

The step level difference between the $Al_2O_3$ phase and the oxide crystal phase other than $Al_2O_3$ phase on the surface of the solidified body composed of the ceramic composite for light conversion according to the present invention is determined as the absolute value according to the following procedure. The heights of two points of an arbitrary point of the surface of one crystal phase constituting a convex shape and an arbitrary point of the surface of the other crystal phase constituting a concave shape are determined based on an arbitrary plane parallel to the surface to be processed as a reference plane, and then the difference between the two heights is calculated. Specifically, such an arbitrary point of the surface of one crystal phase constituting a convex shape and an arbitrary point of the surface of the other crystal phase constituting a concave shape are preferably points close to each other with the interface interposed between the crystal phase constituting a convex shape and the crystal phase constituting a concave shape. Further the measuring point consisting of such two points is set at 12 places in the present invention, and the step level difference is determined by averaging the measuring results of them. Therefore, that the step level difference between the $Al_2O_3$ phase and the oxide crystal phase other than $Al_2O_3$ phase is 0.005 μm or less means that the average value of the measuring result for each of the step level differences in arbitrary 12 places according to the method described above is 0.005 μm or less.

For example, when the ceramic composite for light conversion and a light emitting element are bonded by a surface activating bonding method, it is possible to bond them to each other even if the step level difference is more than 0.005 μm, but the bond strength decreases as the step level difference increases, and thus irregularity is generated on the bonding interface in some cases. Therefore, by reducing the step level difference to 0.005 μm or less, it is possible to obtain bond strength without any problem for practical use.

Next, an example of the schematic cross-sectional view of a light-emitting device using the ceramic composite for light conversion obtained according to the present invention is illustrated FIG. 1. This light-emitting device includes of a light emitting element 2 emitting light with a peak at a wavelength of 400 to 500 nm and a ceramic composite 1 for light conversion including a oxide crystal phase emitting yellow fluorescence with a peak at a wavelength of 550 to 560 nm, and is characterized in utilizing fluorescence obtained through irradiation the ceramic composite 1 for light conversion with light emitted from the light emitting element 2 and then wavelength conversion of the light transmitted the ceramic composite 1 for light conversion and the light emitted from the light emitting element 2 by the oxide crystal phase emitting yellow fluorescence contained in the ceramic composite 1 for light conversion. In the figure, numeral 3 denotes a flip chip electrode terminal, numeral 4 denotes an anode electrode, and numeral 5 denotes a cathode electrode.

A light emitting element emitting light with a peak at a wavelength of 400 to 500 nm is an element emitting light of a violet to blue color, and, for example, a violet to blue light emitted from a light emitting diode or an element emitting laser beam is incident on a ceramic composite for light conversion subjected to the adjustment of chromaticity so as to obtain a white color according to the incident wavelength. Fluorescence of a yellow color from an excited fluorescent substance phase and transmitted light of a violet to blue color from a non-fluorescent substance phase are homogeneously mixed in the structure in which an oxide crystal phases are continuously and three-dimensionally entangled with each other, and uniformly distributed, and thus white light with little color fluctuation may be obtained. A white light-emitting device using a light-emitting diode element as a light-emitting element is called as a white light-emitting diode.

EXAMPLES

Next, Examples of the method of producing the ceramic composite for light conversion according to the present invention will be described, but the present invention is not limited to these Examples.

Reference Example

First, a solidified body to be used in Examples was produced. α-$Al_2O_3$ powder (purity of 99.99%), $Y_2O_3$ powder (purity of 99.9%), and $CeO_2$ powder (purity of 99.9%) were weighed so as to be 0.82 mole in terms of $AlO_{3/2}$, 0.175 mole in terms of $YO_{3/2}$, and 0.005 mole, respectively. These powders were wet mixed in ethanol by a ball mill for 16 hours, and then ethanol was removed using an evaporator, thereby obtaining raw powder. The raw powder was pre-melted in a vacuum furnace to form a raw material of unidirectional solidification. Next, this raw material was introduced into a molybdenum crucible as it was, the crucible was set in a unidirectional solidification apparatus, and the raw material was melted under a pressure of $1.33 \times 10^{-3}$ Pa ($10^{-5}$ Torr). Next, in the same atmosphere, the crucible was pulled down at a velocity of 5 mm/hour to obtain a solidified body with a structure, in which an $Al_2O_3$ phase and a YAG:Ce phase emitting fluorescence are continuously and three-dimensionally entangled with each other. The solidified body was sliced by a multi-wire saw machine to form a wafer of 2 inches in diameter, thereby obtaining a disc-shaped sample. The slicing plane of the disc-shaped sample was a satin finished plane with an arithmetic mean roughness (Ra) of about 65 nm.

Figure 3:
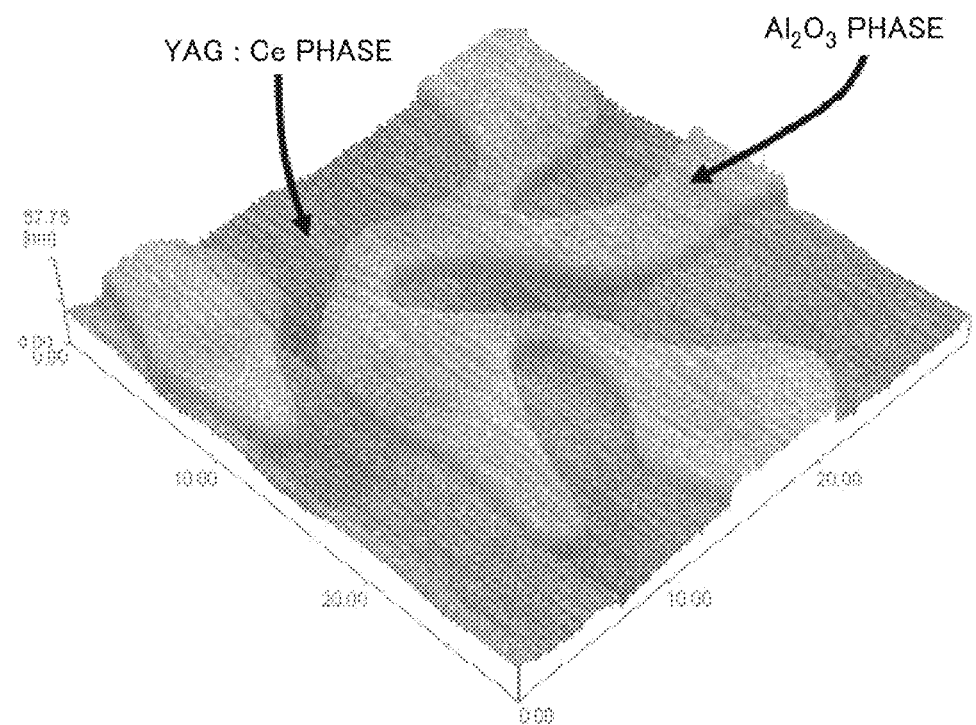
FIG. 3 is a perspective view illustrating a surface configuration of a solidified body after lapping in Reference example of the present invention.

Both of the slicing planes of the disc-shaped sample was subjected to lapping by a diamond abrasive grain. The measurement of the surface configuration and the step level difference in the disc-shaped sample after lapping was performed using an atomic force microscope (AFM). The surface configuration of the disc-shaped sample after lapping is illustrated in FIG. 3. It was confirmed that, on the surface of the disc-shaped sample after lapping, step level difference of 0.020 μm was formed such that an $Al_2O_3$ phase was in a convex shape relative to a YAG:Ce phase. The surface of the disc-shaped sample after lapping was a mirror surface with an arithmetic mean roughness (Ra) of about 5.7 nm.

Meanwhile, hereinafter, in Examples, specific examples in which the present invention is implemented using the sample after lapping are represented, but the present invention is not limited thereto. In the present invention, any of a sample subjected to slicing by a multi-wire saw machine, a sample with a surface subjected to grinding, and a sample with a surface subjected to polishing may also be used. However, if a solidified body having step level difference and the surface roughness in a phase adjusted to the extent that the step and the roughness are not significantly great is used, the time required for the first step and the second step can be shortened, and thus it is preferable to use a solidified body with a surface subjected to grinding, lapping, or polishing.

Here, a method for measuring step level difference by an atomic force microscope (AFM) performed in the present invention will be described. For each of the disc-shaped sample after lapping, a solidified body after dry etching, and a solidified body after CMP, the measurement of step level difference between an $Al_2O_3$ phase and a YAG:Ce phase of the solidified body according to the present invention was performed according to the following method using an atomic force microscope (AFM).

Figure 2:
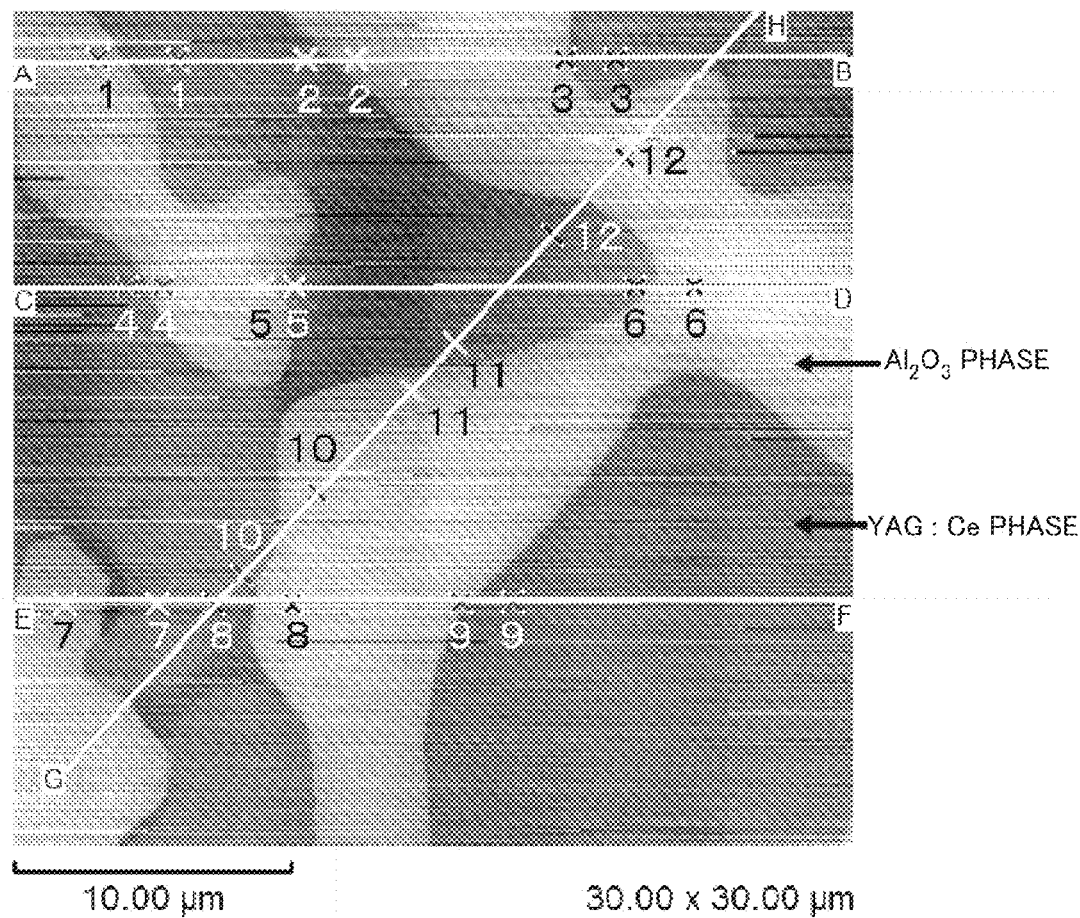
FIG. 2 is a plan view illustrating an example of each of the measuring points of the step level difference on the surface of a solidified body constituting the ceramic composite for light conversion according to the present invention.

On the plane to be processed of the solidified body, as illustrated in FIG. 2, four arbitrary straight lines (A-B, C-D, E-F, G-H) were drawn so as to intersect at least 3 points of the interface between an $Al_2O_3$ phase and a YAG:Ce phase. Subsequently, a point of the surface of the $Al_2O_3$ phase and a point of the surface of the YAG:Ce phase locating closely to the interface on the straight line and interposing an intersection point of each of the straight lines and the interface therebetween were set to be 3 pairs for each of the straight lines. The difference in height (height difference between two points written with the same number from the reference plane) from a reference plane parallel to an arbitrarily provided plane to be processed to the point was measured for 12 places in total, the measured values were averaged to determine the step level difference.

Example 1

Figure 4:
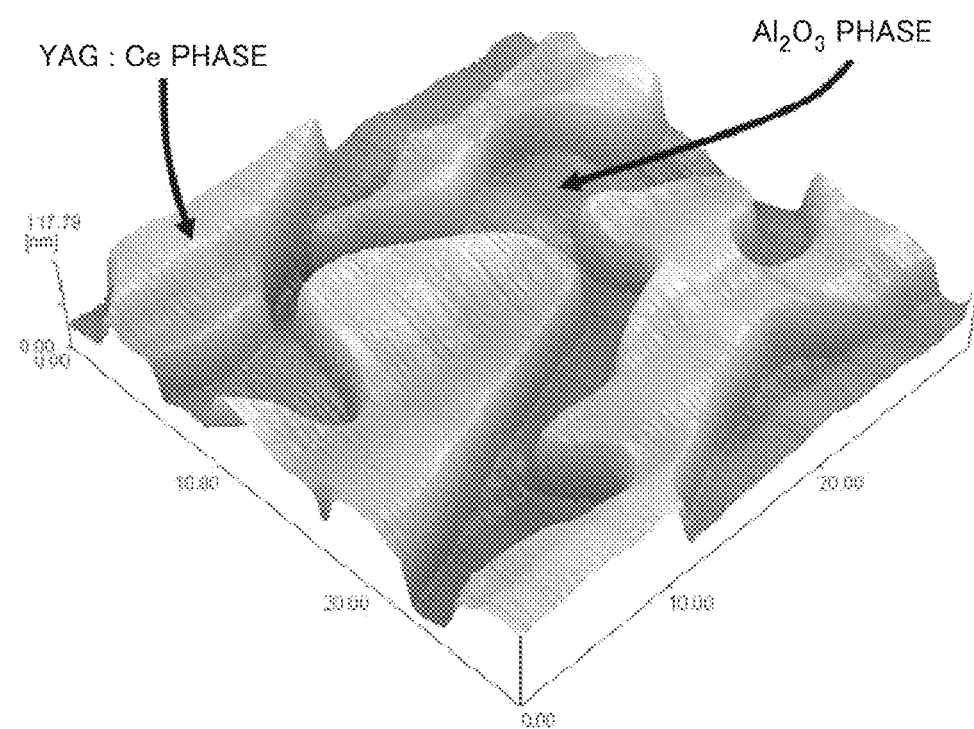
FIG. 4 is a perspective view illustrating a surface configuration of a solidified body after dry etching in Example 1 of the present invention.
Figure 5:
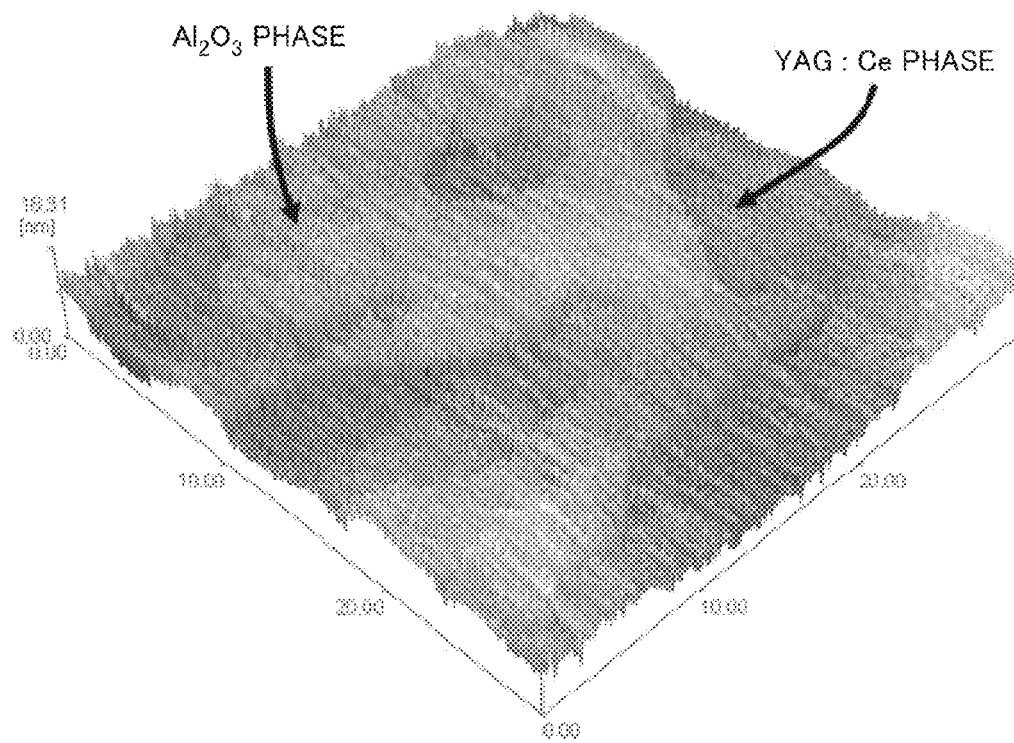
FIG. 5 is a perspective view illustrating a surface configuration of a solidified body after CMP in Example 1 of the present invention.

Next, Example 1 of the ceramic composite for light conversion according to the present invention will be described. The disc-shaped sample after lapping, which was produced according to Reference Example, was subjected to dry etching by an ICP type dry etching apparatus. As etching gas, mixed gas of $BCl_3$ and Ar was used. In addition, under a condition of an antenna power of 700 W and a bias power of 300 W, dry etching was performed for 1 minute. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. The processed surface configuration of the solidified body after dry etching is illustrated in FIG. 4. Next, CMP was performed according to the following method, whereby the ceramic composite for light conversion according to Example 1 was obtained. For a polishing liquid, slurry obtained by diluting "Quartron (registered trademark) PL-2L" of colloidal silica polishing slurry having a silica particle content of 20% by mass and manufactured by FUSO CHEMICAL CO., LTD. with pure water so as to have a silica particle content of 2% by mass was used. First, the solidified body (disc-shaped sample) after dry etching was installed to the polishing head of a CMP apparatus, subsequently, pushed the solidified body against a polishing pad of 15 inches in diameter, which was being provided with the polishing liquid and rotating at about 50 rpm (revolution per minute), while rotating the polishing head at about 50 rpm (revolution per minute), thereby performing CMP. As a polishing pad, "IC 1000 (registered trademark) polishing pad" having a surface processed with grid-shaped grooves at a 15 mm interval and manufactured by Nitta Haas Incorporated was used. In addition, the unit load applied to the solidified body (disc-shaped sample) after dry etching was 33 kPa, the feed rate of the polishing liquid was 10 mL/min, and the processing time was 2 minutes. The measurement of surface configuration and the step level difference in the ceramic composite for light conversion according to Example 1 after CMP was performed using an atomic force microscope (AFM), and it was confirmed that the step level difference between the $Al_2O_3$ phase and YAG:Ce phase was 0.003 µm. The surface configuration of the ceramic composite for light conversion according to Example 1 is illustrated in FIG. 5. In addition, the polishing condition and the measurement result of the step level difference in the surface of the ceramic composite for light conversion thus obtained are illustrated in Table 1.

Example 2

Next, Example 2 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. The solidified body after dry etching (disc-shaped sample) was subjected to CMP in the same method as in Example 1 except that the unit load applied to the solidified body after dry etching was 13 kPa, and the time for CMP was 5 minutes, thereby obtaining the ceramic composite for light conversion according to Example 2. The measurement of surface configuration and the step level difference in the ceramic composite for light conversion according to Example 2 after CMP was performed using an atomic force microscope (AFM), and it was confirmed that the step level difference between the $Al_2O_3$ phase and YAG:Ce phase was 0.002 µm.

Example 3

Next, Example 3 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to CMP in the same method as in Example 1 except that the unit load applied to the solidified body after dry etching (disc-shaped sample) was 46 kPa, and the time for CMP was 1.5 minutes, thereby obtaining the ceramic composite for light conversion according to Example 3. The measurement of surface configuration and the step level difference in the ceramic composite for light conversion according to Example 3 after CMP was performed using an atomic force microscope (AFM), and it was confirmed that the step level difference between the $Al_2O_3$ phase and YAG:Ce phase was 0.005 µm.

Example 4

Next, Example 4 of the ceramic composite for light conversion according to the present invention will be described.

The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. The solidified body after dry etching (disc-shaped sample) was subjected to CMP according to the following method. CMP was performed in the same method as in Example 1 except that, for a polishing liquid, slurry obtained by diluting "Quartron (registered trademark) PL-2L" of colloidal silica polishing slurry having a silica particle content of 20% by mass and manufactured by FUSO CHEMICAL CO., LTD. with pure water so as to have a silica particle content of 0.2% by mass was used and the time for CMP was 12 minutes, thereby obtaining the ceramic composite for light conversion according to Example 4. The measurement of surface configuration and the step level difference in the ceramic composite for light conversion according to Example 4 after CMP was performed using an atomic force microscope (AFM), and it was confirmed that the light conversion between the $Al_2O_3$ phase and YAG:Ce phase was 0.003 µm.

Example 5

Next, Example 5 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. The solidified body after dry etching (disc-shaped sample) was subjected to CMP according to the following method. CMP was performed in the same method as in Example 1 except that, for a polishing liquid, slurry obtained by diluting "Quartron (registered trademark) PL-2L" of colloidal silica polishing slurry having a silica particle content of 20% by mass and manufactured by FUSO CHEMICAL CO., LTD. with pure water so as to have a silica particle content of 4% by mass was used and the time for CMP was 1 minutes, thereby obtaining the ceramic composite for light conversion according to Example 5. The measurement of surface configuration and the step level difference in the ceramic composite for light conversion according to Example 5 after CMP was performed using an atomic force microscope (AFM), and it was confirmed that the step level difference between the $Al_2O_3$ phase and YAG:Ce phase was 0.004 µm.

Example 6

Next, Example 6 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to CMP according to the following method. CMP was performed in the same method as in Example 1 except that, for a polishing liquid, slurry having a pH of about 9 and obtained by diluting "COMPOL (registered trademark) Type 20" of colloidal silica polishing slurry having a silica particle content of 40% by mass and manufactured by Fujimi Incorporated with pure water so as to have a silica particle content of 2% by mass was used and the time for CMP was 2 minutes, thereby obtaining the ceramic composite for light conversion according to Example 6. The measurement of surface configuration and the step level difference in the ceramic composite for light conversion according to Example 6 after CMP was performed using an atomic force microscope (AFM), and it was confirmed that the step level difference between the $Al_2O_3$ phase and YAG:Ce phase was 0.004 µm.

Example 7

Next, Example 7 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to CMP according to the following method. CMP was performed in the same method as in Example 1 except that, for a polishing liquid, slurry having a pH of about 11 and obtained by diluting "Nanopure (registered trademark) NP6502" having a silica particle content of 40% by mass, containing piperazine and tetramethylammonium hydroxide other than a silica particle and manufactured by Nitta Haas Incorporated with pure water so as to have a silica particle content of 0.1% by mass was used and the time for CMP was 1 minutes, thereby obtaining the ceramic composite for light conversion according to Example 7. The measurement of surface configuration and the step level difference in the ceramic composite for light conversion according to Example 7 after CMP was performed using an atomic force microscope (AFM), and it was confirmed that the step level difference between the $Al_2O_3$ phase and YAG:Ce phase was 0.005 µm.

Example 8

Next, Example 8 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to CMP according to the following method. CMP was performed in the same method as in Example 1 except that, for a polishing liquid, slurry having a pH of about 12 and obtained by diluting "Nanopure (registered trademark) NP6504" having a silica particle content of 40% by mass, containing piperazine and tetramethylammonium hydroxide other than a silica particle and manufactured by Nitta Haas Incorporated with pure water so as to have a silica particle content of 0.1% by mass was used and the time for CMP was 1 minutes, thereby obtaining the ceramic composite for light conversion according to Example 8. The measurement of surface configuration and the step level difference in the ceramic composite for light conversion according to Example 8 after CMP was performed using an atomic force microscope (AFM), and it was confirmed that the step level difference between the $Al_2O_3$ phase and YAG:Ce phase was 0.005 µm.

Example 9

Next, Example 9 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to CMP according to the following method. CMP was performed in the same method as in Example 1 except that the unit load applied to the solidified body after dry etching was 8 kPa, and the time for CMP was 30 minutes, thereby obtaining the ceramic composite for light conversion according to Example 9. The measurement of surface configuration and the step level difference in the ceramic composite for light conversion according to Example 9 after CMP was performed using an atomic force microscope (AFM), and it was confirmed that the step level difference between the $Al_2O_3$ phase and YAG:Ce phase was 0.003 µm.

Example 10

Next, Example 10 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to CMP according to the following method. CMP was performed in the same method as in Example 1 except that, for a polishing liquid, slurry obtained by diluting "Quartron (registered trademark) PL-2L" of colloidal silica polishing slurry having a silica particle content of 20% by mass and manufactured by FUSO CHEMICAL CO., LTD. with pure water so as to have a silica particle content of 0.05% by mass was used and the time for CMP was 50 minutes, thereby obtaining the ceramic composite for light conversion according to Example 10. The measurement of surface configuration and the step level difference in the ceramic composite for light conversion according to Example 10 after CMP was performed using an atomic force microscope (AFM), and it was confirmed that the step level difference between the $Al_2O_3$ phase and YAG:Ce phase was 0.004 µm.

Example 11

Next, Example 11 of the ceramic composite for light conversion according to the present invention will be described. The disc-shaped sample after lapping, which was produced according to Reference Example, was subjected to dry etching in the same method as in Example 1. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 µm. Thus obtained solidified body after dry etching (disc-shaped sample) was subjected to MP according to the following method. For a polishing liquid, polishing slurry of oily dispersion medium having a content of a diamond particle with an average particle size of about 20 nm of 0.1% by mass and containing a nonionic surfactant other than the diamond particle was used. First, the solidified body (disc-shaped sample) after dry etching was installed to a work holder of an MP apparatus, subsequently, the surface of the solidified body was pressed against a surface plate for polishing and pushed against a surface plate for polishing made of tin with a diameter of 15 inches, which was provided with the polishing liquid and rotated at about 30 rpm (revolution per minute), while rotating the work holder at about 30 rpm (revolution per minute), thereby performing MP. The unit load applied to the solidified body (disc-shaped sample) after dry etching was 10 kPa, the feed rate of the polishing liquid was 2 mL/min, and the processing time was 1 minutes. The measurement of surface configuration and the step level difference in the ceramic composite for light conversion according to Example 11 after MP was performed using an atomic force microscope (AFM), and it was confirmed that the step level difference between the $Al_2O_3$ phase and YAG:Ce phase was 0.004 µm.

Example 12

Next, Example 12 of the ceramic composite for light conversion according to the present invention will be described. The disc-shaped sample after lapping, which was produced according to Reference Example, was subjected to dry etching in the same method as in Example 1 except that the time for etching was 6 minutes. The surface configuration of the solidified body after dry etching was measured using an atomic force microscope (AFM), and the result was that the YAG:Ce phase was in a convex shape relative to the $Al_2O_3$ phase and the step level difference therebetween was about 0.400 µm. Next, the solidified body after dry etching (disc-shaped sample) was subjected to CMP in the same method as in Example 1 except that the time for CMP was 10 minutes, thereby obtaining the ceramic composite for light conversion according to Example 12. The measurement of surface configuration and the step level difference in the ceramic composite for light conversion according to Example 12 after CMP was performed using an atomic force microscope (AFM), and it was confirmed that the step level difference between the $Al_2O_3$ phase and YAG:Ce phase was 0.003 µm.

Example 13

Next, Example 13 of the ceramic composite for light conversion according to the present invention will be described. The disc-shaped sample after lapping, which was produced according to Reference Example, was subjected to dry etching using a RIE type dry etching apparatus. As an etching gas, $CF_4$ gas was used. In addition, dry etching was performed under a condition of an RF power of 200 W, a gas flow rate of 20 sccm, and a gas pressure of 2.0 Pa for 30 minutes. The surface configuration of the solidified body after dry etching was measured using an atomic force microscope (AFM), and the result was that the YAG:Ce phase was in a convex shape relative to the $Al_2O_3$ phase and the step level difference therebetween was about 0.100 μm. Next, the solidified body after dry etching (disc-shaped sample) was subjected to CMP in the same method as in Example 1, thereby obtaining the ceramic composite for light conversion according to Example 13. The measurement of surface configuration and the step level difference in the ceramic composite for light conversion according to Example 13 after CMP was performed using an atomic force microscope (AFM), and it was confirmed that the step level difference between the $Al_2O_3$ phase and YAG:Ce phase was 0.003 μm.

was 1% by mass, and the processing time was 360 minutes, thereby obtaining the ceramic composite for light conversion according to Comparative Example 2. The measurement of surface configuration and the step level difference in the ceramic composite for light conversion according to Comparative Example 2 after MP was performed using an atomic force microscope (AFM), and it was confirmed that the $Al_2O_3$ phase was in a convex shape relative to the YAG:Ce phase, and the step level difference between the $Al_2O_3$ phase and YAG:Ce phase was 0.011 μm.

TABLE 1

|  | Dry etching | Unit load (kPa) | Polishing liquid | Concentration of abrasive grain (mass %) | pH | Processing time (min.) | step level difference (μm) |
|---|---|---|---|---|---|---|---|
| Example 1 | ICP - 1 min. | 33 | PL-2L | 2 | 7 | 2 | 0.003 |
| Example 2 | ICP - 1 min. | 13 | PL-2L | 2 | 7 | 5 | 0.002 |
| Example 3 | ICP - 1 min. | 46 | PL-2L | 2 | 7 | 1.5 | 0.005 |
| Example 4 | ICP - 1 min. | 33 | PL-2L | 0.2 | 7 | 12 | 0.003 |
| Example 5 | ICP - 1 min. | 33 | PL-2L | 4 | 7 | 1 | 0.004 |
| Example 6 | ICP - 1 min. | 33 | COMPOL-20 | 2 | 9 | 2 | 0.004 |
| Example 7 | ICP - 1 min. | 33 | NP6502 | 0.1 | 11 | 1 | 0.005 |
| Example 8 | ICP - 1 min. | 33 | NP6504 | 0.1 | 12 | 1 | 0.005 |
| Example 9 | ICP - 1 min. | 8 | PL-2L | 2 | 7 | 30 | 0.003 |
| Example 10 | ICP - 1 min. | 33 | PL-2L | 0.05 | 7 | 50 | 0.004 |
| Example 11 | ICP - 1 min. | 10 | Nanodiamond slurry | 0.1 |  | 1 | 0.004 |
| Example 12 | ICP - 6 min. | 33 | PL-2L | 2 | 7 | 10 | 0.003 |
| Example 13 | RIE - 30 min. | 33 | PL-2L | 2 | 7 | 2 | 0.003 |
| Comparative Example 1 | Nil | 33 | PL-2L | 2 | 7 | 2 | 0.092 |
| Comparative Example 2 | Nil | 50 | Nanodiamond slurry | 1 |  | 360 | 0.011 |

Comparative Example 1

Figure 6:
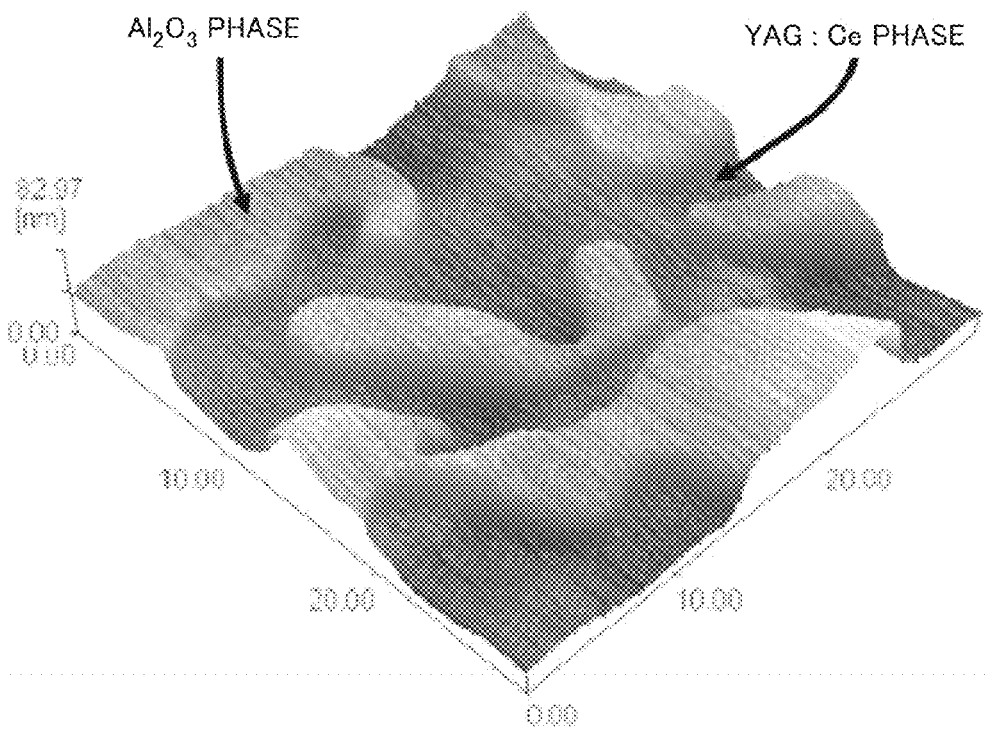
FIG. 6 is a perspective view illustrating a surface configuration of a solidified body after CMP in Comparative Example 1 of the present invention.

Comparative Example 1 of the ceramic composite for light conversion according to the present invention will be described. The disc-shaped sample after lapping, which was produced according to Reference Example, was subjected to CMP in the same method as in Example 1 except not performing dry etching, thereby obtaining the ceramic composite for light conversion according to Comparative Example 1. After that, the step level difference between the $Al_2O_3$ phase and YAG:Ce phase did not increased though the time for CMP was further extended. The measurement of surface configuration and the step level difference in the ceramic composite for light conversion according to Comparative example 1 after CMP was performed using an atomic force microscope (AFM), and it was confirmed that the step level difference between the $Al_2O_3$ phase and YAG:Ce phase was 0.092 μm, and the surface of the ceramic composite for light conversion according to Comparative Example 1 was that the $Al_2O_3$ phase was in a convex shape relative to the YAG:Ce phase. The surface configuration of the ceramic composite for light conversion according to Comparative Example 1 is illustrated in FIG. 6.

Comparative Example 2

Comparative Example 2 of the ceramic composite for light conversion according to the present invention will be described. The disc-shaped sample after lapping, which was produced according to Reference Example, was subjected to MP in the same method as in Example 11 except that dry etching was not performed, and the unit load applied was 50 kPa, the content of a diamond particle of a polishing liquid

REFERENCE CHARACTERS LIST

1: Ceramic composite for light conversion
2: Light-emitting element (light-emitting diode element)
3: Flip chip electrode terminal
4: Anode electrode
5: Cathode electrode

The invention claimed is:

1. A method for producing a ceramic composite for light conversion, comprising:
   a first step of forming a step level difference such that an oxide crystal phase other than $Al_2O_3$ phase of a surface of a solidified body is in a convex shape relative to an $Al_2O_3$ phase by performing dry etching to the surface of the solidified body having a structure in which the $Al_2O_3$ phase and the oxide crystal phase other than $Al_2O_3$ phase are continuously and three-dimensionally entangled with each other; and
   a second step of reducing the step level difference by performing CMP or MP to the solidified body subjected to the dry etching.

2. The method for producing a ceramic composite for light conversion according to claim 1, wherein the oxide crystal phase other than $Al_2O_3$ phase is a fluorescence emitting phosphor, and is a YAG ($Y_3Al_5O_{12}$) phase including Ce or a YAG ($Y_3Al_5O_{12}$) phase containing Ce and Gd.

3. The method for producing a ceramic composite for light conversion according to claim 2, wherein the step level difference after the second step is 0.005 μm or less.

4. The method for producing a ceramic composite for light conversion according to claim 3, wherein a processing for reducing the step level difference in the second step is a chemical mechanical polishing (CMP).

5. The method for producing a ceramic composite for light conversion according to claim 4, wherein slurry containing silica particles in an amount of 0.1% by mass or more and less than 5% by mass is used as a polishing liquid when performing the chemical mechanical polishing (CMP).

6. The method for producing a ceramic composite for light conversion according to claim 5, wherein a unit load of 10 to 50 kPa is applied when performing the chemical mechanical polishing (CMP).

7. The method for producing a ceramic composite for light conversion according to claim 4, wherein a unit load of 10 to 50 kPa is applied when performing the chemical mechanical polishing (CMP).

8. The method for producing a ceramic composite for light conversion according to claim 2, wherein a processing for reducing the step level difference in the second step is a chemical mechanical polishing (CMP).

9. The method for producing a ceramic composite for light conversion according to claim 8, wherein slurry containing silica particles in an amount of 0.1% by mass or more and less than 5% by mass is used as a polishing liquid when performing the chemical mechanical polishing (CMP).

10. The method for producing a ceramic composite for light conversion according to claim 9, wherein a unit load of 10 to 50 kPa is applied when performing the chemical mechanical polishing (CMP).

11. The method for producing a ceramic composite for light conversion according to claim 8, wherein a unit load of 10 to 50 kPa is applied when performing the chemical mechanical polishing (CMP).

12. The method for producing a ceramic composite for light conversion according to claim 1, wherein the step level difference after the second step is 0.005 μm or less.

13. The method for producing a ceramic composite for light conversion according to claim 12, wherein a processing for reducing the step level difference in the second step is a chemical mechanical polishing (CMP).

14. The method for producing a ceramic composite for light conversion according to claim 13, wherein slurry containing silica particles in an amount of 0.1% by mass or more and less than 5% by mass is used as a polishing liquid when performing the chemical mechanical polishing (CMP).

15. The method for producing a ceramic composite for light conversion according to claim 14, wherein a unit load of 10 to 50 kPa is applied when performing the chemical mechanical polishing (CMP).

16. The method for producing a ceramic composite for light conversion according to claim 13, wherein a unit load of 10 to 50 kPa is applied when performing the chemical mechanical polishing (CMP).

17. The method for producing a ceramic composite for light conversion according to claim 1, wherein a processing for reducing the step level difference in the second step is a chemical mechanical polishing (CMP).

18. The method for producing a ceramic composite for light conversion according to claim 17, wherein slurry containing silica particles in an amount of 0.1% by mass or more and less than 5% by mass is used as a polishing liquid when performing the chemical mechanical polishing (CMP).

19. The method for producing a ceramic composite for light conversion according to claim 18, wherein a unit load of 10 to 50 kPa is applied when performing the chemical mechanical polishing (CMP).

20. The method for producing a ceramic composite for light conversion according to claim 17, wherein a unit load of 10 to 50 kPa is applied when performing the chemical mechanical polishing (CMP).

* * * * *